US008194888B2

(12) United States Patent
Brophy

(10) Patent No.: US 8,194,888 B2
(45) Date of Patent: Jun. 5, 2012

(54) SYSTEM AND METHOD FOR VOLUME CONTROL BASED ON LOCATION

(75) Inventor: Timothy J. Brophy, Schwenksville, PA (US)

(73) Assignee: Symbol Technologies, Inc., Holtsville, NY (US)

( * ) Notice: Subject to any disclaimer, the term of this patent is extended or adjusted under 35 U.S.C. 154(b) by 904 days.

(21) Appl. No.: 12/240,435

(22) Filed: Sep. 29, 2008

(65) Prior Publication Data

US 2010/0080402 A1 Apr. 1, 2010

(51) Int. Cl.
*H03G 3/00* (2006.01)

(52) U.S. Cl. ... 381/107; 381/106; 381/109; 340/359.13; 340/359.15; 340/573.1; 340/573.2

(58) Field of Classification Search .......... 381/104–109; 340/359.13, 359.15, 573.1, 573.2
See application file for complete search history.

(56) References Cited

U.S. PATENT DOCUMENTS

2006/0023892 A1* 2/2006 Schultz .......................... 381/58
2006/0095156 A1* 5/2006 Baiada et al. ................. 700/213
2006/0202818 A1* 9/2006 Greenberg ............... 340/539.13

* cited by examiner

*Primary Examiner* — Evan Pert
*Assistant Examiner* — Mark A Laurenzi

(57) ABSTRACT

A system and method control a volume based on location. The system comprises a switch and an asset. The switch is for a network including an operating area for a region. The region is divided into a plurality of zones. The asset is disposed in one of the zones. The asset includes an audio output device. The audio output device is set to a predetermined volume level as a function of one of the plurality of the zones in which the asset is disposed.

11 Claims, 2 Drawing Sheets

SYSTEM AND METHOD FOR VOLUME CONTROL BASED ON LOCATION

FIELD OF THE INVENTION

The present invention relates generally to a system and method for volume control of a mobile unit based on location. Specifically, the system may include a predetermined volume level for a zone and automatically set the volume control of the mobile unit.

BACKGROUND

A network may provide services to a region including a variety of areas in which different activities may occur. For example, when the network provides services to a school, a first area may be a cafeteria while a second area may be a library. A mobile unit with an audio output device may be disposed in the first area and move into the second area. The first area may be designated as an open environment where the audio output device may be used with any volume level. The second area may be designated as a restricted environment where the audio output device may be used with a strict volume level. In the case where the mobile unit is moved from the first area to the second area, a user of the mobile unit may forget to set the volume level to the predetermined level of the area. Thus, the mobile unit may have a volume level that is too high for the area. Conversely, in the case where the mobile unit is moved from the second area to the first area, a user of the mobile unit may not set the volume level, thereby leaving the mobile unit having a volume level that may be too low for the area.

SUMMARY OF THE INVENTION

The present invention relates to a system and method for controlling a volume based on location. The system comprises a switch and an asset. The switch is for a network including an operating area for a region. The region is divided into a plurality of zones. The asset is disposed in one of the zones. The asset includes an audio output device. The audio output device is set to a predetermined volume level as a function of one of the plurality of the zones in which the asset is disposed.

DETAILED DESCRIPTION

Figure 1:
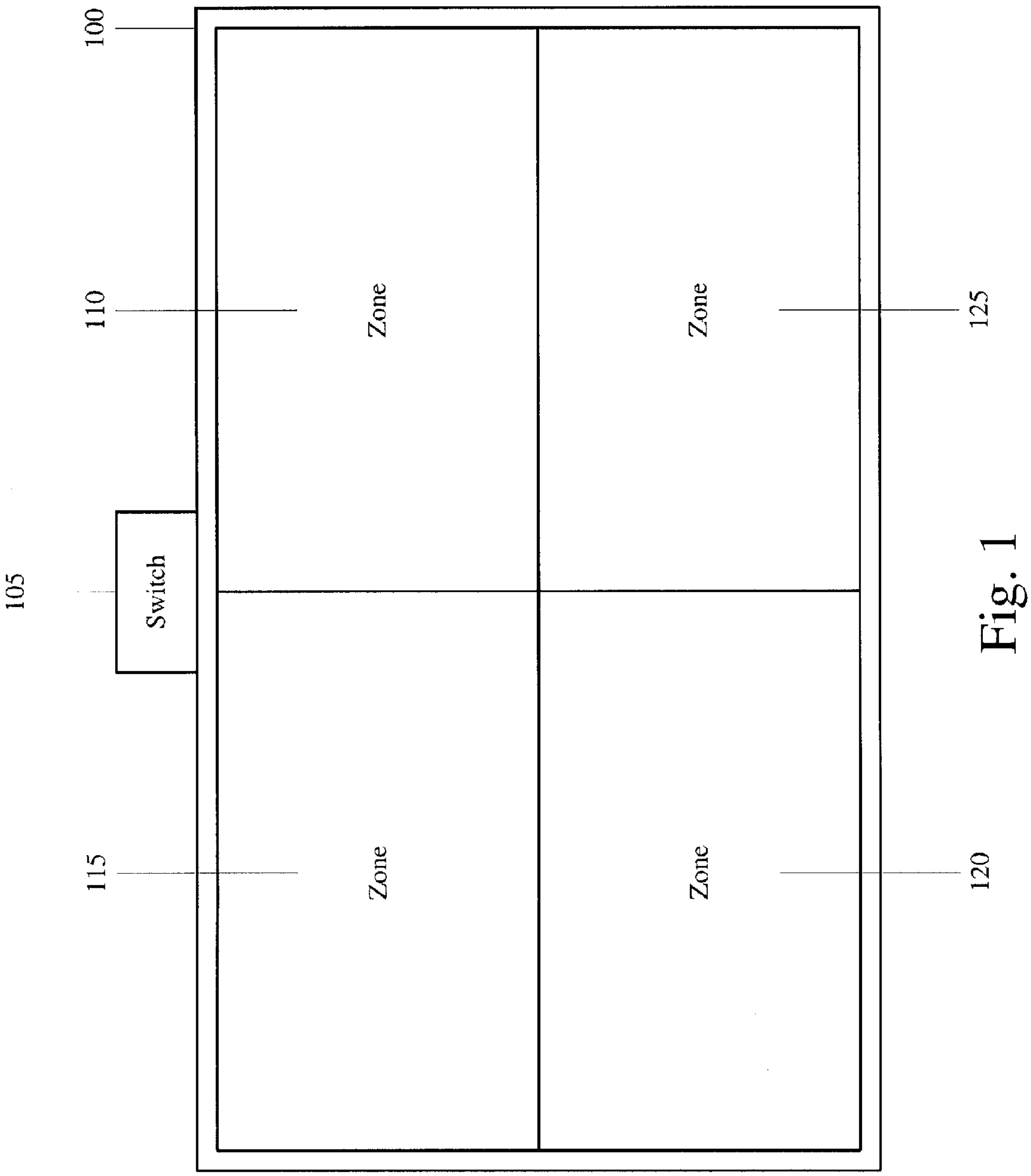
FIG. 1 shows a system according to an exemplary embodiment of the present invention.

The exemplary embodiments of the present invention may be further understood with reference to the following description and the appended drawings, wherein like elements are referred to with the same reference numerals. The exemplary embodiments of the present invention describe a system and method for volume control based on location. According to the exemplary embodiments of the present invention, the system may include a network providing services for a region including a plurality of zones where each of the zones includes a parameter for a volume level. The volume control, the locations, the zones, the volume level, and an associated method will be discussed in further detail below.

FIG. 1 shows a system including a region 100 according to an exemplary embodiment of the present invention. The region 100 may be an operating area of a network provided by a switch 105. The switch 105 may be a network device configured to direct transmissions received from a first network component to a second network component. In particular, the switch 105 may be a radio frequency (RF) switch. According to the exemplary embodiments of the present invention, the switch 105 may also be configured to execute analyses relating to the region 100.

It should be noted that the use of the switch 105 is only exemplary. The region 100 may include other types of network components configured to perform the analyses such as a server, a network management arrangement, etc. The region 100 may further include network components such as access points configured to increase the operating area of the network, thereby increasing the area of the region 100.

The region 100 may be divided into a plurality of zones. As illustrated, the region 100 may include zones 110, 115, 120, 125. The switch 105 may be configured with a fencing module such as a Smart Opportunistic Location Engine (SOLE). The SOLE may enable the switch 105 to generate a virtual fence to separate the region 100 into the zones 110, 115, 120, 125. Specifically, the SOLE may enable a Geo-Fencing functionality. The Geo-Fencing functionality may enable allowing or preventing authentication of users based on location; receiving of alerts when a tag or asset enters or exits a "fence" disposed between zones; etc. According to the exemplary embodiments of the present invention, the Geo-Fencing functionality may be used to change a volume control of an asset such as a mobile unit (MU) according to the zone in which the MU is disposed or the zone in which the MU is moved.

The SOLE may be used to provide a location of an asset such as the MU, a passive radio frequency (RF) tag, a semi-passive RF tag, an active RF tag, etc. The SOLE may also be used to provide a location of other assets including rogues. The SOLE may be capable of returning a location that is accurate to within several centimeters. The SOLE may receive data relating to the region 100, the zones 110, 115, 120, 125, objects disposed therein (e.g., obstacles that affect transmission pathways), etc. The SOLE may incorporate the data to determine the locations. The switch 105 in which the SOLE is disposed may report the location as desired to the asset using standard interfaces such as Application Level Event (ALE). In addition to the received data discussed above, the SOLE may determine the location using a variety of input variables. For example, the SOLE may use training data, user configuration data, received signal strength indication (RSSI) data, RF barriers, smart surroundings data, runtime RF environment data, a previous location of the asset, a time difference of arrival (TDOA) data, angle of arrival (AOA) data, etc.

It should be noted that the use of the SOLE is only exemplary. According to the exemplary embodiments of the present invention, the switch 105 may use any conventional means of determining a location of an asset. Furthermore, the switch 105 or the SOLE may receive a location from a remote source (e.g., external third part location engines).

It should also be noted that the received data and the input variables received by the SOLE may be updated. That is, the SOLE may be a self-learning process capable of adapting with changes that may occur to the region 100 and the zones 110, 115, 120, 125. The SOLE may also be altered according to the needs of the region 100. For example, the SOLE may be an open platform capable of supporting new architectures, future algorithms, support for newer asset types, etc.

According to the exemplary embodiments of the present invention, the switch 105 may transmit a command message to an asset such as the MU. It should be noted that the following discussion refers to the asset being the MU. However, the MU may represent any type of asset such as RF tags. The command message may relate to an audio output functionality of the MU. Specifically, the command message may set a volume level of the audio output functionality. The switch 105 may determine the volume level as a function of the zone in which the MU is disposed. The switch 105 may include a database indicating a predetermined volume level of each of the zones 110, 115, 120, 135. Thus, when the switch 105 determines the location of the MU, the switch 105 may accordingly send an appropriate command message to the MU indicating the predetermined volume level to be set for the audio output functionality.

The switch 105 may further be configured to transmit the command message while the MU is moving. Specifically, the switch 105 may transmit the command message when the SOLE indicates that the MU is moving from a first zone into another zone where the predetermined volume level is different. The SOLE may be configured to determine whether the MU has changed position and predict a zone in which the MU may move. Consequently, the switch 105 may transmit a prepared command message indicating a setting for the volume level of the zone upon the MU entering the zone. For example, if the MU is currently disposed in zone 110 and is moving, the switch 105 may determine that the MU is moving toward zone 115. Once the switch 105 determines that the MU has crossed the "fence" separating zone 110 and zone 115, the switch 105 may transmit the command message so that the volume level is set on the MU at the predetermined level.

The switch 105 or the SOLE may include further functionalities to transmit the command message prior to entry into a zone. Specifically, the switch 105 may predict when the MU moves into another zone. For example, the switch 105 may include prior known locations of the MU stored in the database. Through comparison of the prior known locations, the switch 105 may be configured to predict a next location in which the MU is to be disposed. Consequently, the switch 105 may transmit the command message accordingly. For example, if the MU was disposed toward a center of zone 110, the switch 105 may store this known location in the database. The MU may move toward the "fence" between zone 110 and zone 125. The new location may be stored in the database. The switch 105 may further determine that the MU again moves even closer to the "fence" between zone 110 and zone 125. The switch 105 may predict that the MU will move from zone 110 to zone 125. The switch 105 may further predict when the MU may potentially change zones. Consequently, the switch 105 may transmit the command data so that prior to changing zones, the MU may have received the command data so that the volume level is set at the level of the predicted zone.

Figure 2:
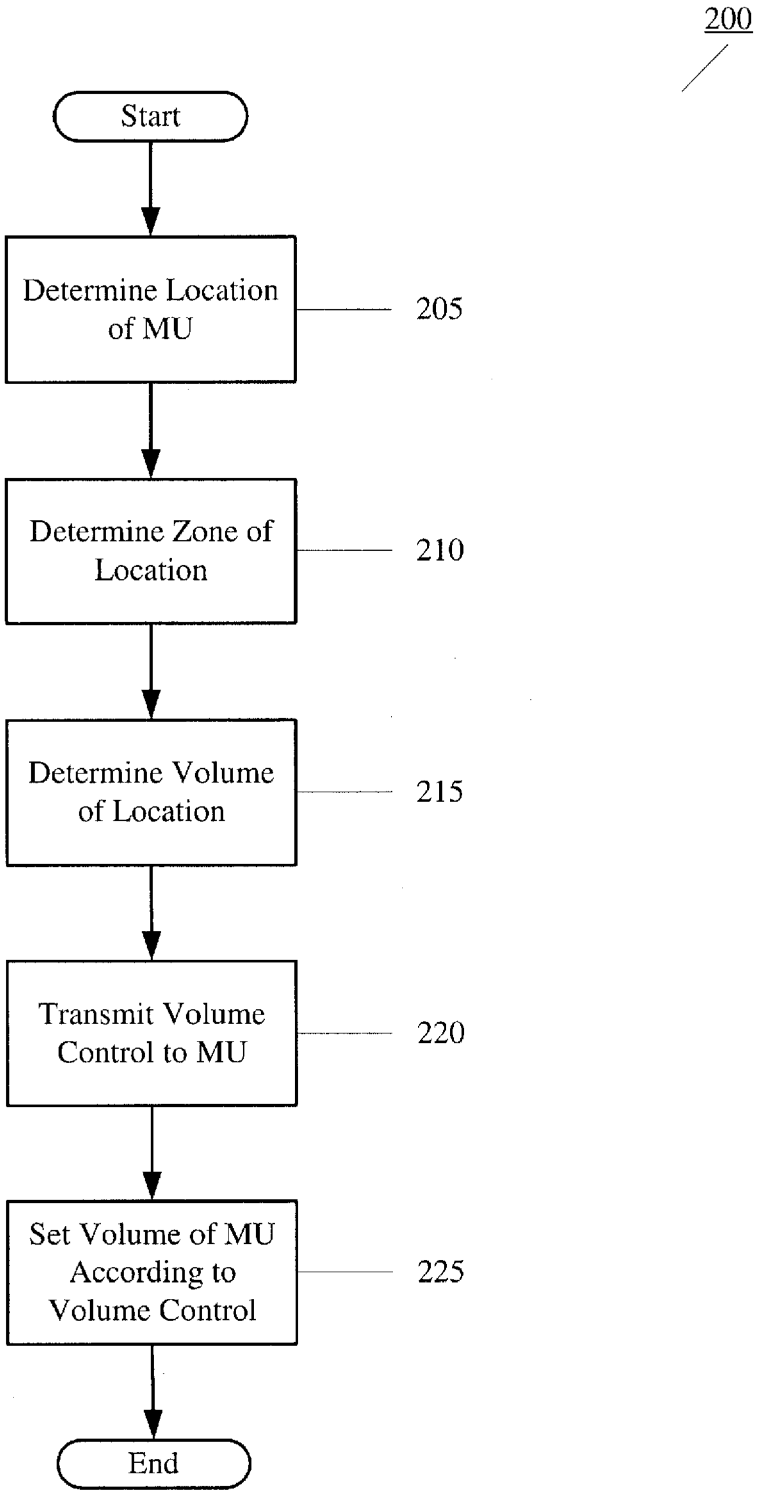
FIG. 2 shows a method according to an exemplary embodiment of the present invention.

FIG. 2 shows a method 200 according to an exemplary embodiment of the present invention. The method 200 may enable a volume control to be set for an asset disposed in a network. The network may include an operating area for a region that is divided into a plurality of zones where each zone includes a predetermined volume level that is to be set for each asset disposed therein. The method 200 will be described with reference to the region 100, the switch 105 and the zones 110, 115, 120, 125 of FIG. 1. Similarly to the description above of FIG. 1, the asset will be generally described as a MU. However, it should be noted that the MU may refer to any asset such as RF tags.

In step 205, a location of the MU is determined. The switch 105 or the SOLE of the switch 105 may perform the location determination using any known methods. For example, the switch 105 may use triangulation, RSSI data, GPS, etc. It should be noted that the location of the MU may also be received from a remote source that has performed the location determination. The remote source may be include further networks in which the switch 105 is connected, from the MU, etc.

In step 210, a corresponding zone of the location determined in step 205 is determined. The switch 105 or the SOLE may include a database relating to the region 100 and the zones 110, 115, 120, 125. Thus, when the location of the MU is determined (or received), a reference to a topology of the region 100 may indicate the zone in which the MU is disposed. For example, the location of the MU may be converted into coordinates corresponding to the region 100. The switch 105 may reference the topology and determine the corresponding zone as a function of the coordinates.

In step 215, the volume level of the zone is determined. The database of the switch 105 or the SOLE may further include the corresponding volume level for each zone 110, 115, 120, 125. For example, if the region 100 is a school environment, zone 110 may be a cafeteria; zones 115 and 125 may be a classroom; and zone 120 may be a library. Thus, the volume level for zone 110 may be set to high; the volume level for zones 115, 125 may be set to medium; and the volume level for zone 120 may be set to low. It should be noted that the volume level may be set to a numeric value. For example, a volume level of ten may be high, a volume level of one may be low, a volume level of zero may be mute, and a volume level of an in between value may be a corresponding level (e.g., a volume level of eight is 80% of the maximum value of ten).

In step 220, a command message including the volume level determined in step 215 is transmitted to the MU. In a first example, the command message may be received by the MU and the MU may automatically set a volume control to the indicated volume level. In a second example, the command message may be received by the MU and an alert may be displayed to the user of the MU so that the volume control may be set no higher than the indicated volume level. Furthermore, when an alert is displayed, a corresponding sound may be played or a vibration may be performed to further indicate that the alert has been displayed. Thus, in step 225, the volume control of the MU may be set to the corresponding volume level of the zone in which the MU is disposed.

It should be noted that the method 200 may include additional steps depending on whether the switch 105 or the SOLE is capable of further functionalities. For example, if the switch 105 is capable of predicting when the MU will move from a first zone with a first volume level to a second zone with a second volume level, the method 200 may include a further step between steps 210 and 215. Thus, the volume level of the predicted zone may be determined in step 215.

It should be noted that the switch 105 or the SOLE may be used for further functionalities. That is, the setting of the volume control may be one exemplary embodiment in which the Geo-Fencing functionality is used. In a second example, the Geo-Fencing functionality may be used for authentication purposes. That is, like the volume level, the database of the switch 105 or the SOLE may indicate assets that may be authorized to be disposed in a zone. When the switch 105 or the SOLE determines the location of the MU and the MU is authorized to be disposed in the corresponding zone, the switch 105 or the SOLE may enable association of the MU with the network. In contrast, when the switch 105 or the SOLE determines the location of the MU and the MU is not authorized to be disposed in the corresponding zone, the switch 105 or the SOLE may prevent association with the network. It should further be noted that the SOLE may be embodied in an independent device that performs the above described functionalities.

In a third example, the Geo-Fencing functionality may provide various access control lists (ACL) as a function of the zone. The ACL may indicate the various functionalities available to an asset when it is disposed in a particular zone. An authentication may further be associated with the asset to further allow or prevent access to the various functionalities.

In a fourth example, the Geo-Fencing functionality may provide different access protocols as a function of the zone. When a MU associates with the network of the region 100, the location of the MU and the corresponding zone may indicate the access protocol. The access protocol may initially be a login page in which a user of the MU enters data to associate the MU with the network. The access protocol may subsequently load a respective screen, page, etc. as a function of the zone. For example, when the region 100 is a school and the MU is disposed in zone 110 which is a cafeteria, the subsequent load may be a page indicating a menu for the day.

In a fifth example, the Geo-Fencing functionality may enable a maximum rate for data transmissions/receptions (e.g., bandwidth) as a function of the zone. For example, the region 100 may be a building; zone 120 may represent a parking lot; and zone 110 may represent an office. When the MU is disposed in zone 120, the bandwidth may be limited while when the MU is disposed in zone 110, the bandwidth may be unlimited.

According to the exemplary embodiments of the present invention, a region may include an operating area of a network. The region may be divided into a plurality of zones. The division may include actual or virtual "fences" that are created using, for example, a Geo-Fencing functionality. The Geo-Fencing functionality may be performed by a switch of the network or a SOLE of the switch. Each zone may indicate a variety of parameters including a volume level in which an asset disposed in a particular zone must not set a volume control to go beyond. The switch or the SOLE may transmit a command message to automatically set the volume control of an asset or the command message may alert a user of the asset to manually change the volume control to the indicated volume level of the zone. In this manner, an audio output component of an asset disposed in a zone may be set no higher than a predetermined level. Therefore, in a quiet environment, the audio output component may be muted so as to maintain the quiet environment. In a loud environment, the audio output component may be set to a high level so as to enable a user to hear sounds from the component.

It will be apparent to those skilled in the art that various modifications may be made in the present invention, without departing from the spirit or scope of the invention. Thus, it is intended that the present invention cover the modifications and variations of this invention provided they come within the scope of the appended claims and their equivalents.

What is claimed is:

1. A switch for a network including an operating area for a region, the region being divided into a plurality of zones, the switch comprising:

a processor configured to determine a location of an asset disposed in one of the plurality of zones; and a memory storing a database indicating a audio volume level setting for each of the plurality of zones, wherein the processor can look up the audio volume level setting associated with the zone of the located asset, wherein the switch operable to transmit a command message to the located asset providing the audio volume level setting associated with the zone of the located asset for setting an audio output device of the asset.

2. A system, comprising:

a switch for a network including an operating area for a region, the region being divided into a plurality of zones where each zone in a database indicates an audio volume level setting, the switch including a location engine to determine a zone where an asset is located, and wherein the switch can look up the audio volume level setting associated with the zone of the located asset and provide a command message to the located asset providing the audio volume level setting associated with the zone of the located asset; and an asset located in one of the zones, the asset including an audio output device, the asset being sent the command message from the switch for the indicated audio volume level setting for setting the audio output device of the asset.

3. The system of claim 2, wherein the asset is a mobile unit.

4. The system of claim 2, wherein the region is a school and the zones include a cafeteria, a classroom, and a library.

5. The system of claim 2, wherein the asset will automatically set its audio output device to the indicated audio volume level setting.

6. The system of claim 2, wherein upon receiving the command message the asset provides an alert to a user indicating that the audio output device is limited to the indicated audio volume level setting.

7. The system of claim 6, wherein the user can manually control the audio output device to a setting not more than the indicated audio volume level setting.

8. The system of claim 2, wherein the location engine predicts another one of the zones into which the asset will move, and the switch provides the command message before the asset moves into that zone into which the asset will move.

9. The system of claim 2, wherein the location engine is further configured to provide an access control list for the asset in the database as a function of the one of the zones, wherein the switch limit access for the asset to functionalities of the access control list depending on the zone where the asset is located.

10. The system of claim 2, wherein the location engine is further configured to provide an access protocols for the asset in the database as a function of the one of the zones, wherein the switch control an access protocol for the asset depending on the zone where the asset is located.

11. The system of claim 2, wherein the location engine is further configured a transmission rate determination as a function of the one of the zones, wherein the switch limits a operating bandwidth for the asset depending on the zone where the asset is located.

* * * * *